United States Patent
Baek et al.

(10) Patent No.: US 11,894,424 B2
(45) Date of Patent: Feb. 6, 2024

(54) METHOD FOR FABRICATING A FIELD-EFFECT TRANSISTOR WITH SIZE-REDUCED SOURCE/DRAIN EPITAXY

(71) Applicant: POSTECH Research and Business Development Foundation, Pohang-si (KR)

(72) Inventors: Rock Hyun Baek, Pohang-si (KR); Jun Sik Yoon, Pohang-si (KR); Jin Su Jeong, Daegu (KR); Seung Hwan Lee, Busan (KR)

(73) Assignee: POSTECH Research and Business Development Foundation, Pohang-si (KR)

( * ) Notice: Subject to any disclaimer, the term of this patent is extended or adjusted under 35 U.S.C. 154(b) by 0 days.

(21) Appl. No.: 18/071,876

(22) Filed: Nov. 30, 2022

(65) Prior Publication Data

US 2023/0100196 A1    Mar. 30, 2023

Related U.S. Application Data

(63) Continuation of application No. 16/898,706, filed on Jun. 11, 2020, now abandoned.

(30) Foreign Application Priority Data

Jun. 24, 2019  (KR) .................. 10-2019-0074877

(51) Int. Cl.
| | | |
|---|---|---|
| H01L 29/08 | (2006.01) | |
| H01L 29/10 | (2006.01) | |
| H01L 29/49 | (2006.01) | |
| H01L 29/51 | (2006.01) | |
| H01L 29/66 | (2006.01) | |
| H01L 29/78 | (2006.01) | |
| H01L 21/311 | (2006.01) | |
| H01L 21/3205 | (2006.01) | |
| H01L 29/423 | (2006.01) | |

(52) U.S. Cl.
CPC ...... *H01L 29/0847* (2013.01); *H01L 29/1079* (2013.01); *H01L 29/4941* (2013.01); *H01L 29/518* (2013.01); *H01L 29/66795* (2013.01); *H01L 29/785* (2013.01); *H01L 2029/7858* (2013.01)

(58) Field of Classification Search
CPC ............ H01L 29/0847; H01L 29/1079; H01L 29/4941; H01L 29/518; H01L 29/66795; H01L 29/785; H01L 2029/7858; H01L 29/66545; H01L 29/7849; H01L 21/31144; H01L 21/32051; H01L 29/41725; H01L 29/42392; H01L 29/517; H01L 29/66045; H01L 29/665; H01L 29/7843; H01L 29/7848; H01L 29/7855
See application file for complete search history.

(56) References Cited

U.S. PATENT DOCUMENTS

2018/0342596 A1* 11/2018 Lee .................... H01L 29/6656

* cited by examiner

*Primary Examiner* — Herve-Louis Y Assouman
(74) *Attorney, Agent, or Firm* — LEX IP MEISTER, PLLC (57) ABSTRACT

Disclosed is a fin field-effect transistor having size-reduced source/drain regions so that a merging phenomenon of epitaxial structures between transistors in a layout is prevented, thus increasing the number of transistors per unit area, and so that an additional mask process is not required, thus maintain processing costs without change, and a method of manufacturing the same.

11 Claims, 10 Drawing Sheets

METHOD FOR FABRICATING A FIELD-EFFECT TRANSISTOR WITH SIZE-REDUCED SOURCE/DRAIN EPITAXY

CROSS REFERENCE TO RELATED APPLICATIONS

This application is a Continuation Application of U.S. patent application Ser. No. 16/898,706 filed on Jun. 11, 2020, which claims priority based on Korean Patent Application No. 10-2019-0074877, filed on Jun. 24, 2019, the entire contents of which are incorporated as a part of the present specification.

TECHNICAL FIELD

The present invention relates to a fin field-effect transistor having size-reduced source/drain regions so as to prevent the epitaxial structures of the source/drain regions from merging between transistors, and a method of manufacturing the same.

BACKGROUND ART

A metal-oxide-semiconductor field-effect transistor (hereinafter, referred to as a 'MOSFET') is a device including three terminals: a source, a drain, and a gate. The MOSFET includes a channel of an N-type semiconductor material or a P-type semiconductor material, and is broadly classified according to the material thereof into an NMOSFET, a PMOSFET, or a cMOSFET (complementary MOSFET), which is a device having both materials.

The MOSFET is a core device that functions as a switch or an amplifier and is used in all electronic apparatuses which perform logic operations, for example, computers, cellular phones, and those related to the Internet of Things.

Referring to the development status thereof, in the case of the MOSFET, a cost reduction of unit cells, a performance increase, and a power consumption reduction have been simultaneously achieved through scaling according to Moore's law.

In the case of a conventionally used MOSFET, a method of reducing the unit area of individual devices and also reducing an operation voltage has been adopted so as to reduce the power consumption required to drive apparatuses, to improve the performance of unit devices, and to reduce the cost of unit devices. However, when the size of the device is reduced to several tens of nanometers, the leakage current flowing through the region under a channel between a source and a drain that is not electrically controlled by a gate is increased, thereby power consumption is increased.

Therefore, in order to effectively control the channel between the source and the drain, by forming the channel so as to have a three-dimensional structure, a fin-type FET (FinFET) for dramatically improving the driving ability of the channel by the gate and a GAA-type (gate-all-around) FET for enabling the gate to wrap the entire region of the channel to thus effectively control the channel have been developed. However, this three-dimensional channel structure alone does not effectively control a gate-induced drain leakage (GIDL) caused by diffusion of impurities from the source/drain regions to the inside of the channel.

In order to minimize the GIDL, a selective epitaxial growth (hereinafter, referred to as 'SEG') process, which is capable of being performed at relatively low temperatures when the source/drain regions are formed, is performed, thus reducing the diffusion of impurities. Since a separate implantation process is not performed during this SEG process, there is no damage to substrates or oxides caused by the implantation. Further, in the SEG process, uniaxial stress may be effectively applied to the channel, thereby solving the problem of reduced mobility caused by the reduction of biaxial stress due to the reduction of a gate length.

However, since the number of silicon atoms per unit area depends on a lattice direction, the epitaxial structure of the source/drain regions grows into a diamond structure, occupying a larger area than the channel. Accordingly, a minimum space is required between transistors in order to prevent merging of the epitaxial structures of the source/drain regions between the transistors. Therefore, there is a limitation in that the number of transistors per unit area is not increased in the layout of a circuit even when the transistor is reduced in size itself.

The sizes of the epitaxial structures may be adjusted with respect to merging of the epitaxial structures of the source/drain regions.

Korean Laid-Open Patent Application No. 10-2019-0003297 discloses a field-effect transistor having a Fin structure (FinFET). The patent also discloses that, in order to reduce the widths of epitaxial structures of source/drain regions, a quartz etching process may be performed on the epitaxial structures of diamond-shaped source/drain regions to remove the portion of the source/drain regions on the top, thereby preventing problems or damage occurring in an integrated circuit having a high device density. In this patent, the sizes of the epitaxial structures of the source/drain regions may be adjusted, but new problems arise in that the process is complicated or additional costs are required due to the addition of the quartz etching process. Further, this patent still has a drawback in that the space between transistors must be kept large because merging of the epitaxial structures of the source/drain regions of adjacent devices cannot be prevented.

PRIOR ART DOCUMENT

Patent Document

Korean Laid-Open Patent Application No. 10-2019-0003297 (Published on Jan. 9, 2019), Method of forming shaped source/drain epitaxial layers of a semiconductor device

SUMMARY OF INVENTION

Technical Problem

Various studies have been conducted to manufacture a fin field-effect transistor having a new structure for preventing merging of epitaxial structures of source/drain regions and for reducing the space between transistors, which are well-known conventional problems. As a result of the studies, during a selective epitaxial growth process, it has been found possible to reduce the shape of epitaxial structures of the finally obtained source/drain regions by restricting the lateral growth of the epitaxial structure in a Y-axis direction, thereby solving the problem of merging or contact of the epitaxial structures of the source/drain regions even when the space between the transistors is reduced.

Accordingly, an object of the present invention is to provide a fin field-effect transistor in which the sizes of the epitaxial structures of source/drain regions are capable of being adjusted, and a method of manufacturing the same.

Solution to Problem

In order to accomplish the above object, the present invention provides a fin field-effect transistor that includes a substrate, a channel formed in a predetermined region of the substrate, a gate formed in a predetermined region of the channel, source/drain regions formed at both sides of the channel along the sides of the channel on the substrate, and an insulating layer formed between the gate and the source/drain regions on an upper portion of the channel, so as to wrap the channel. A maximum width ratio (W1/W2) of the width W2 of each of the source/drain regions to the width W1 of the channel is 1 based on the width direction (Y-axis direction, width) of the channel.

The present invention also provides a method of manufacturing a fin field-effect transistor. The method includes (a) forming a channel, a gate, and an insulating layer in a predetermined region of a substrate so that the insulating layer is formed from both sides of the gate on an upper portion of the substrate, (b) performing etching along side surfaces of the channel and the insulating layer for forming source/drain regions so as to etch even an upper portion of one side of the substrate, so that a designated region of the substrate and a region of the channel are exposed and so that the insulating layer, patterned so as to wrap the exposed region of the substrate, is formed on the substrate, and (c) forming the source/drain regions, in which the growth in a width direction (Y-axis direction) is restricted through a selective epitaxial growth process, in the exposed region of the substrate and the channel.

The etching process of step (b) includes simultaneously forming the insulating layer, which is in contact with a side surface of the gate, and the patterned insulating layer, which is positioned on the substrate, using one mask.

Advantageous Effects of Invention

In a fin field-effect transistor according to the present invention, it is possible to adjust the sizes of the epitaxial structures of source/drain regions, thereby effectively preventing the phenomenon of merging of the epitaxial structures between transistors occurring in a conventional layout. Accordingly, it is possible to reduce the space between the transistors, thereby effectively increasing the number of transistors per unit area.

In addition, it is possible to improve the performance of transistors and reduce power consumption using the effect in which parasitic capacitance is reduced when the sizes of the epitaxial structures of the source/drain regions are reduced.

In addition, in an etching process for forming the source/drain regions, an insulating layer, which is positioned on a channel, and a patterned insulating layer, which is positioned on a substrate, are formed using one mask. Accordingly, since an additional mask process is not required, compared to a conventional semiconductor process, it is possible to maintain processing costs without change.

Further, it is possible to reduce the occurrence of thickness variation or nonuniformity of epitaxial structures in source/drain regions between devices during processing. Accordingly, the variability of changing device characteristics due to the variation and nonuniformity is significantly reduced. Such variability is directly related to the efficiency of production of integrated circuits, and improved wafer yield can be expected due to the reduced variability.

BRIEF DESCRIPTION OF DRAWINGS

The above and other objects, features and advantages of the present invention will be more clearly understood from the following detailed description taken in conjunction with the accompanying drawings, in which.

DESCRIPTION OF EMBODIMENTS

The above objects, other objects, features and advantages of the present invention will be readily understood through the following preferred embodiments associated with the accompanying drawings. However, the present invention is not limited to the embodiments described herein, and may be embodied in other forms. Rather, the embodiments introduced herein are provided in order to ensure that the disclosed contents are thorough and complete and that the spirit of the present invention is sufficiently conveyed to those skilled in the art.

In the present specification, when it is stated that a layer (or film) is on another layer (or film) or substrate, it may be formed directly on another layer (or film) or substrate, or a third layer (or film) may be interposed therebetween. In addition, the size and thickness of components in the drawings are exaggerated for clarity. In this specification, the expression 'and/or' is used with a meaning including at least one of the components listed beforehand and afterwards. Portions denoted by the same reference numerals denote the same components throughout the specification.

The terminology used in this specification is for describing the embodiments and is not intended to limit the present invention. In this specification, the singular form also includes the plural form unless otherwise specified in the phrase. As used herein, 'comprises' and/or 'comprising' mean that the mentioned component, step, operation and/or element does not exclude the presence or addition of one or more other components, steps, operations and/or elements.

Hereinafter, the present invention will be described in more detail with reference to the drawings.

Figure 1:
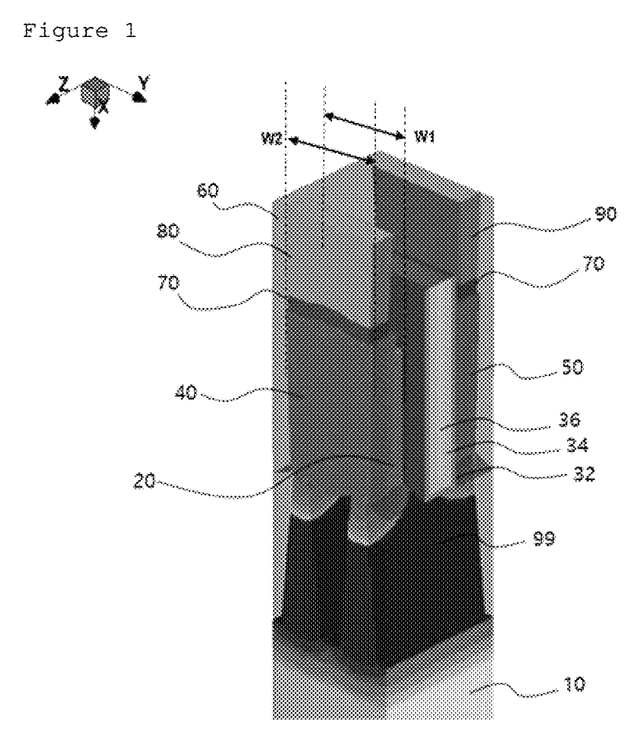
FIG. 1 shows a three-dimensional structure of a fin field-effect transistor according to an embodiment of the present invention.

FIG. 1 shows a three-dimensional structure of a fin field-effect transistor (FinFET, fin field-effect transistor)—according to an embodiment of the present invention.

The above fin field-effect transistor may be applied to field-effect transistors having various structures, in addition to the structure shown in FIG. 1. Examples thereof include a multi-gate structure such as a double- or triple-gate FinFET, a GAA (gate-all-around) structure (nanowire, nanosheet), a lateral structure in which channels are laterally arranged, and a vertical structure in which channels are vertically arranged.

Referring to FIG. 1, the fin field-effect transistor includes a substrate 10, a channel 20 formed in a predetermined region of the substrate 10, a gate metal wire 36, a work function metal 34, and a gate oxide 36, which are formed in a predetermined region of the channel 20 and in the region of a gate 30, source/drain regions 40 and 50 formed at both sides of the channel along the side surfaces of the channel 20 on the substrate 10, an insulating layer 60 formed between the gate 30 and the source/drain regions 40 and 50 on an upper portion of the channel 20, so as to wrap the channel 20, a metal silicide layer 70 formed on upper portions of the source/drain regions 40 and 50 so as to wrap the source/drain regions 40 and 50, source/drain region electrodes 80 and 90 formed on an upper portion of the metal silicide layer 70, and a punch-through stopper 99 formed in a predetermined region of the substrate 10 corresponding in position to the lower portion of the channel 20.

The source/drain regions of a conventional fin field-effect transistor are formed through a selective epitaxial growth process, and the epitaxial structure thereof has a column-shaped lower portion and a diamond-shaped upper portion. The diamond-shaped upper portion is advantageous in reducing the resistance of the source/drain regions and increasing the uniaxial stress in the channel as the volume thereof is increased. However, merging occurs between the epitaxial structures of the source/drain regions, causing short circuits between the source and the drain of the device, which cause problems with the reliability of the device and the circuit. Accordingly, a selective etching process is conventionally performed on the diamond shape of the upper portion, but there are problems in that processing is complicated and costs are increased.

In the fin field-effect transistor according to an embodiment of the present invention, the sizes of the epitaxial structures of the source/drain regions 40 and 50 are adjusted, and the patterned insulating layer may be used during a selective epitaxial growth process instead of a method of introducing a separate etching process, whereby lateral growth in the Y-axis direction is restricted, thus making it easy to adjust the source/drain regions. For example, when the sizes of the epitaxial structures of the source/drain regions 40 and 50 are reduced, merging or contact between the epitaxial structures, which is considered a problem in the conventional art, does not occur. However, when the sizes of the source/drain regions 40 and 50 are reduced, the resistance of the source/drain regions 40 and 50 is increased. Accordingly, constraint in the size reduction of the source/drain regions thereof is required.

In the X-Y-Z coordinates of FIG. 1, the X-Z plane is defined as a cross-section of the fin field-effect transistor, the Y-Z plane is defined as a front surface thereof, and the X-Y plane is defined as side surfaces thereof (a left side surface and a right side surface). In the X-Y-Z coordinates, the distance in an X-axis direction is defined as the height, the distance in a Y-axis direction is defined as the width, and the distance in a Z-axis direction is defined as the length. In the present specification, the X-axis direction means the height direction, the Y-axis direction means the width direction, and the Z-axis direction means the length direction.

In FIG. 1, the channel 20 and the source/drain regions 40 and 50 are shown in the form of a rectangular parallelepiped, but the form thereof may be modified or changed depending on the shape of the fin field-effect transistor. The width W1 of the channel 20 depends on the shape of the channel 20, and means the width of the base, which is in contact with the substrate 10. For example, in the case of a trapezoidal fin-type structure, the width of the lower portion of the trapezoid is defined as the width of the channel 20. Further, in the case of the width W2 of the source/drain regions 40 and 50, the source/drain regions may be grown using a selective epitaxial growth process which thus can achieve irregular shapes (excluding, however, the diamond shape), but the growth is performed only in a predetermined region, as described below. Accordingly, the difference between the widths of the lower and upper portions is not large. The width W2 of the source/drain regions 40 and 50 means the largest width.

The source/drain regions 40 and 50 are vertically (Z-axis direction) and laterally (Y-axis direction) grown from the trench region formed on the substrate 10 within the region restricted by the selective epitaxial growth process, thereby having an epitaxial structure. Since merging or contact between the epitaxial structures occurs due to the lateral growth of the vertically grown epitaxial structure (i.e., the diamond shape in the upper portion), the merging or contact between the epitaxial structures can be prevented if the lateral growth is restricted.

The restriction of the lateral growth of the epitaxial structure in the Y-axis direction results in a size reduction (or adjustment) of the source/drain regions 40 and 50. The restriction of the growth in the Y-axis direction is related to amplification of the length, height, and width parameters of the source/drain regions 40 and 50. In effect, the source/drain regions 40 and 50 may be reduced in size by reducing the width thereof. According to the use of the fin field-effect transistor, the length and height of the source/drain regions 40 and 50 may be reduced, thereby reducing the size of the regions 40 and 50, but this affects the performance of the device and does not substantially provide the effect of preventing merging or contact between the epitaxial structures, so a description thereof is not made in the present invention.

Preferably, the size reduction of the source/drain regions 40 and 50 is achieved through the restriction of the lateral growth of the epitaxial structure in the Y-axis direction. In other words, the ratio (W1/W2) between the width W2 of each of the source/drain regions 40 and 50 and the width W1 of the channel 20 may be adjusted.

This may be expressed using an equation. Based on the width direction (Y-axis direction, width) of the channel 20, the maximum width ratio (W1/W2) of the width W2 of each of the source/drain regions 40 and 50 to the width W1 of the channel 20 is 1.

The sentence 'the maximum width ratio is 1' means that the width W2 of the source/drain regions 40 and 50 and the width W1 of the channel 20 are the same as each other. The width of the source/drain regions 40 and 50 is capable of being reduced so as to be the same as the width of the channel 20. When the width of the source/drain regions 40 and 50 is reduced so as to be the same as the width of the channel 20, parasitic capacitance is greatly reduced, which thereby improves the performance of the device.

This may be expressed as specific numerical values. The width W1 of the channel 20 is in the range of 4 nm to 50 nm, and the height of the channel 20 is in the range of 4 nm to 60 nm. Further, the length of the channel 20 is in the range of 10 nm to 200 nm. These numerical values may vary depending on the type of fin field-effect transistor, and are not limited to a predetermined range in the present invention. For example, in the case of a FinFET, the height may be 60 nm, but in the case of another structure, for example, in the case of a GAA (gate-all-around) structure (nanowire, nanosheet), the height may be larger than that of the FinFET.

In consideration of the width W1 of the channel 20, the width W2 of the source/drain regions 40 and 50 that are in contact with the channel 20 according to the present invention may be at least equal to the width W1 of the channel 20, and the lower limit thereof may range from 4 nm to 50 nm.

Further, it is not easy to limit the upper limit of the width W2 of the source/drain regions 40 and 50 to a specific numerical value, but if the upper limit is required to be specified, the number of channels 20, the space (pitch) between channels 20, and the extent of growth of the epitaxial structure need to be considered.

In the fin field-effect transistor, one channel or a plurality of channels may be formed, and the shape and the number of the channels are capable of being variously modified and changed depending on the structure of the fin field-effect transistor.

Figure 2:
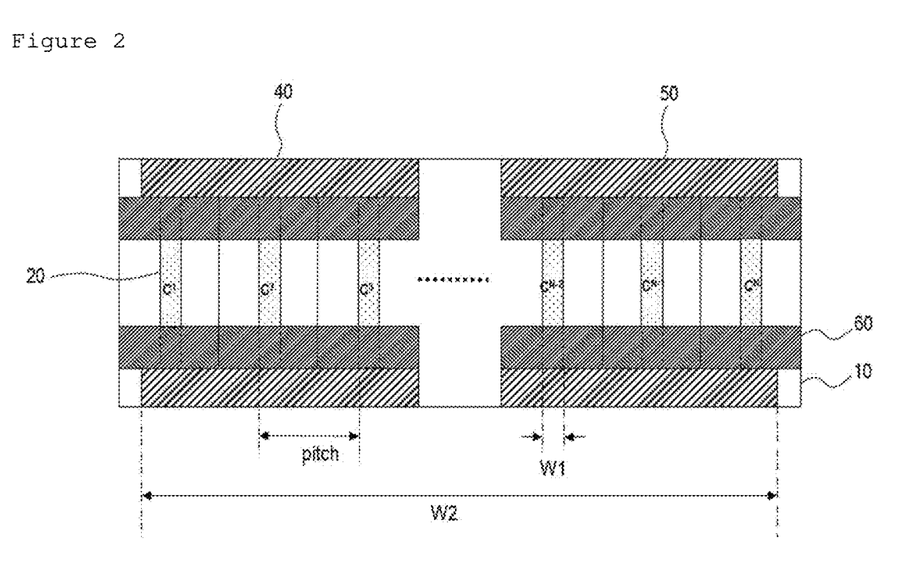
FIG. 2 is a view showing that a plurality of channels is formed.

As one example, FIG. 2 is a view showing that a plurality of channels 20 is formed in a fin field-effect transistor. $C^1$ indicates a first channel, $C^N$ indicates a Nth channel, and N channels are formed on a substrate. The N channels 20 formed on the substrate 10 are disposed so as to be spaced apart from each other at a predetermined interval (indicates a pitch). In this structure, the epitaxial structures of the source/drain regions 40 and 50 grow so as to come into contact with all of the N channels 20, and are capable of growing up to a level of 50 nm based on the channels $C^1$ and $C^N$ positioned at both ends thereof. When this is expressed as an equation, it may be defined by the following Mathematical Equation 1. The number of channels 20, the pitch, and the upper limit of the width W2 of the source/drain regions 40 and 50, which corresponds to 100 nm, may be provided.

$$W2=W1+N x Pitch+100 \text{ nm} \quad \text{[Mathematical Equation 1]}$$

(In the above Equation, W1 and W2 are as defined above, Nx is the number of channels, and Pitch is the interval between channels.)

Preferably, Nx is in the range of 1 to 2000, and Pitch is in the range of 10 nm to 200 nm.

The case where the width W2 of the source/drain regions 40 and 50 is smaller than the width W1 of the channel 20 (greater than 1) is disadvantageous in terms of driving of the device. Conversely, in the case where the width W2 of the source/drain regions 40 and 50 is larger than the width W1 of the channel 20, merging of the epitaxial structures of the source/drain regions 40 and 50 occurs. However, since the width W2 of the source/drain regions 40 and 50 is obtained within a specific range according to the present invention, the source/drain regions 40 and 50, formed using a selective epitaxial growth process, are capable of being reduced in size without affecting the driving of the device, thereby preventing the epitaxial structures from merging.

The length of the source/drain regions 40 and 50 may be 4 nm to 80 nm, 4 nm to 70 nm, or 5 nm to 60 nm, and the height thereof may be 4 nm to 100 nm so as to be larger than or equal to the height of the channel 20.

As a result, the epitaxial structures of the source/drain regions 40 and 50 of the present invention are substantially neither merged nor in contact with each other.

Accordingly, in the present invention, the lateral growth of the epitaxial structure in the Y-axis direction is restricted to perform a typical selective epitaxial growth process, so the diffusion of impurities into the channel is reduced compared to a conventional impurity implantation process. Further, the advantage of causing uniaxial stress is maintained without change, and the disadvantage of inability to reduce the size of the active area of the fin field-effect transistor due to the large size of the source/drain regions 40 and 50 is overcome.

That is, the active area of the fin field-effect transistor may be reduced as the source/drain regions 40 and 50 are reduced in size due to the restriction of the lateral growth of the epitaxial structure in the Y-axis direction. Accordingly, parasitic capacitance between the source/drain regions 40 and 50 and the gate 30 may be reduced, thereby improving the performance of the device.

Further, since merging or contact between the epitaxial structures is prevented, the minimum space required between the fin field-effect transistors may be further reduced, making it easy to reduce the size of the fin field-effect transistor. Even when the size of the fin field-effect transistor is reduced, there is no effect on the drivability of the device, so the number of transistors per unit area (transistor density) may be increased in view of the layout of a circuit.

As described above, the size reduction of the source/drain regions 40 and 50 is achieved using the growth restriction by the insulating layer patterned in the selective epitaxial growth process, without an additional etching process. Accordingly, processing costs may be maintained unchanged due to no additional etching process or additional mask compared to a conventional semiconductor process.

Specifically, the fin field-effect transistor according to the present invention is manufactured using a method that includes (a) forming a channel, a gate, and an insulating layer in a predetermined region of a substrate so that the insulating layer is formed from both sides of the gate on an upper portion of the substrate, (b) performing etching along side surfaces of the channel and the insulating layer so as to etch even an upper portion of one side of the substrate for forming source/drain regions, so that a designated region of the substrate is exposed and so that the insulating layer, patterned so as to wrap the exposed region of the substrate, is formed on the substrate, and (c) forming the source/drain regions, in which growth in a width direction (Y-axis direction) is restricted through a selective epitaxial growth process, in the exposed region of the substrate.

Hereinafter, a process of manufacturing a fin field-effect transistor according to an embodiment of the present invention will be described with reference to FIGS. 3 to 10. The diagram positioned at the upper portion of each drawing is the cross-sectional view of the X-Z plane, and the diagram shown at the lower portion thereof is the plane view of the Y-Z plane.

(Step a)

Figure 3:
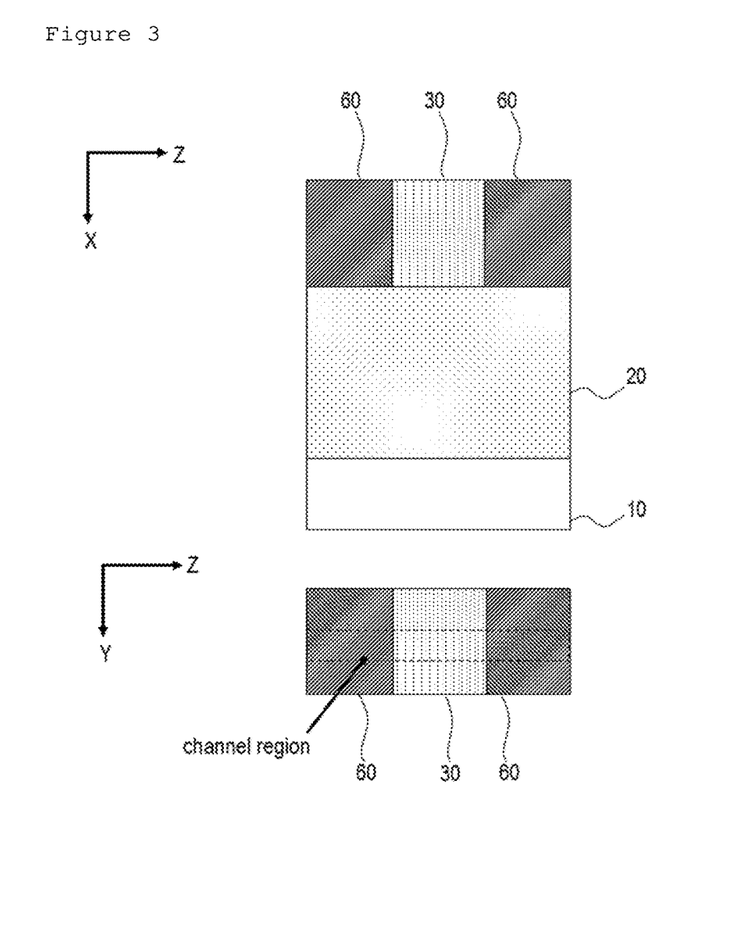
FIGS. 3 to 10 are cross-sectional and plane views showing a process of manufacturing of a fin field-effect transistor according to an embodiment of the present invention.

First, the channel 20, the gate 30, and the insulating layer 60 are formed on the substrate 10 through a deposition process, a lithography process, and an etching process (see FIG. 3).

The type of the substrate 10 is not particularly limited in the present invention, and the substrate may be a substrate 10 commonly used in this field.

Representative examples thereof may include Si, SiGe, Ge, Sn (tin), and compounds of Group III to Group V, which are capable of being applied to a top-down process. The compounds of Group III to Group V may be, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

The substrate 10 may have small amounts of doped impurities, or may be doped with one or more n-type impurities selected from among P, As, and Sb or one or more p-type impurities selected from among B, $BF_2$, Al, and Ga. The impurity introduced into the substrate 10 may depend on the type of the device (NMOS, PMOS), and may be a p-type for an NMOS and an n-type for a PMOS.

The channel 20 may include one or more selected from among GaN, Si, Ge, SiGe, GaAS, W, Co, Pt, ZnO, and In$_2$O$_3$.

The gate 30 may be a polysilicon gate or a replacement metal gate. As the polysilicon gate, well-known gates such as gates doped with polysilicon or polysilicon silicide at a high concentration may be used. The replacement metal gate may have a structure in which a gate oxide, a metal barrier, and a work function metal or a gate oxide, a work function metal, and a gate metal are sequentially layered.

The insulating layer 60 may include one or more selected from the group consisting of SiO$_2$, Al$_2$O$_3$, HfO$_2$, ZrO$_2$, Si$_3$N$_4$, perovskite oxide, and a combination thereof.

Forming each layer including the channel 20, the gate 30, and the insulating layer 60 in a predetermined region of the substrate 10 includes a deposition process, a lithography process, and an etching process. The forming each layer further includes other suitable processes or combinations thereof. Unless otherwise specified, the lithography process and the etching process are sequentially performed after the deposition process, thus forming each layer.

Examples of the deposition process include CVD, physical vapor deposition (PVD), atomic layer deposition (ALD), high density plasma CVD (HDPVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), an evaporation deposition method, plating, other suitable methods, or combinations thereof.

Examples of the lithography process may include any one process among electron beam lithography, nano-imprinting, ion beam lithography, X-ray lithography, extreme ultraviolet lithography, photolithography (using a stepper, scanner, or contact aligner), maskless lithography, or random spraying of nanoparticles, and are not particularly limited in the present invention. Among them, examples of the photolithography process include resist coating (e.g., spin-on coating), soft baking, mask alignment, exposure, baking after exposure, resist development, rinsing, drying (e.g., hard baking), other suitable processes, or a combination thereof.

Examples of the etching process include a dry etching process, a wet etching process, other etching processes, or a combination thereof. In addition to insulating layers such as SiO$_2$ and SiN$_x$, metals such as Cr, Ni, and Al or photoresists may be used as an etching mask material.

Specifically, after the channel 20 and the gate 30 are sequentially deposited on the substrate 10, a photosensitive layer is applied on the deposited gate 30, followed by lithography. Thereafter, an etching process is performed to form the patterned gate 30, and a process of depositing the insulating layer 60 on both sides thereof is performed.

Through the above processes, as shown in FIG. 2, the channel 20, the gate 30, and the insulating layer 60 are formed. The insulating layer 60 is formed from both sides of the gate 30 on the upper portion of the substrate 10.

(Step b)

Figure 4:
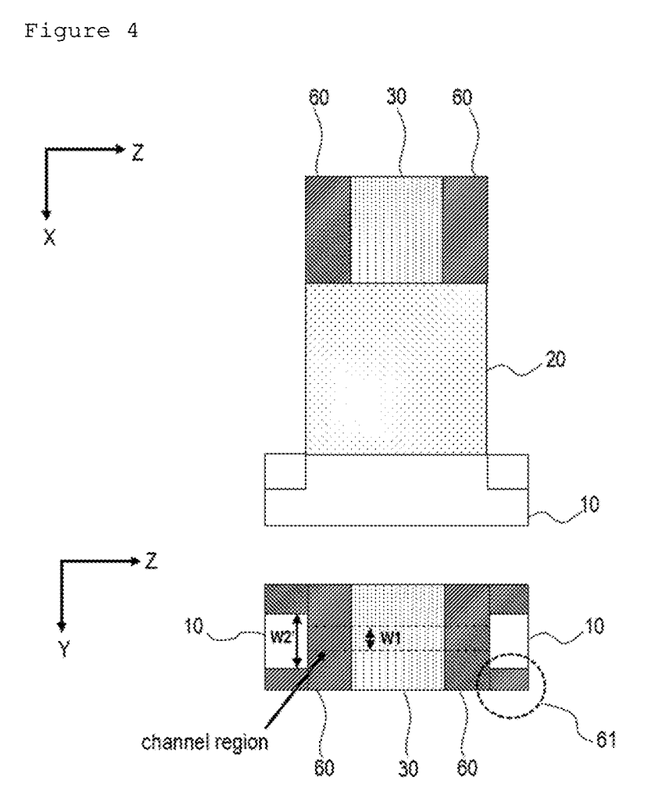

Next, in order to form the source/drain regions 40 and 50, etching is performed along the side surfaces of the channel 20 and the insulating layer 60 so as to etch even the upper portion of one side of the substrate 10, thereby exposing a predetermined region of the substrate 10 and a region of the channel 20 (see FIG. 4).

The etching process may be performed through an anisotropic etching process so that etching is performed as close to vertically as possible with respect to the substrate 10, as in the X-Z plane shown in FIG. 3, thereby securing a vertical-type structure or, if necessary, a trench-type structure.

In the present step, a lithography process and an etching process are performed to expose the substrate 10 and the channel 20, and the exposed surface thereof provides regions where the source/drain regions 40 and 50 are formed using a subsequent selective epitaxial growth process.

In particular, in the present invention, the restriction of the lateral growth of the epitaxial structure in the Y-axis direction may result in the source/drain regions 40 and 50 being reduced in size compared to the source/drain regions of a conventional fin field-effect transistor. That is, through the etching process, patterning of the insulating layer 60 formed on the substrate 10 is performed simultaneously with patterning of the insulating layer 60 in contact with the side surface of the gate 30. With respect to this, the structure, which is wrapped by a patterned insulating layer 61 so as to wrap the exposed region of the substrate 10, is secured.

The patterned insulating layer 61 may be allowed to remain by performing partial patterning when forming a metal silicide and a source/drain metal layer, as will be described later. Alternatively, a wrap-around-contact structure, in which a metal silicide 70 wraps the source/drain regions 40 and 50 after the patterned insulating layer 61 is removed from the substrate 10, may be adopted, thereby allowing the patterned insulating layer to remain in the fin field-effect transistor through deposition of the insulating layer.

The distance W2' between the patterned insulating layers 61 shown in the Y-Z plane of FIG. 4 may be defined as the width of the source/drain regions 40 and 50 in a subsequent process, and the lateral growth of the epitaxial structure in the Y-axis direction is restricted by the patterned insulating layer 61. As a result, the width W2 (FIG. 4) of the source/drain regions 40 and 50 is reduced, thereby ultimately reducing the sizes of the source/drain regions 40 and 50 formed using the selective epitaxial growth process.

As the distance W2' between the patterned insulating layers 61 is reduced, the source/drain regions 40 and 50 may be further reduced in size. In the final field-effect-transistor structure, the maximum width ratio (W1/W2) of the width W2 of each of the source/drain regions 40 and 50 to the width W1 of the channel may be adjusted so as to be 1 based on a width direction (Y-axis direction, width) of the channel 20.

The insulating layer 60, which is in contact with the side surface of the gate 30, and the patterned insulating layer 61, which is positioned on the substrate 10, are capable of being patterned using one mask, which is the same as the mask used during a subsequent process for forming metal silicide 70 or source/drain metal wires 80 and 90. Accordingly, in the present process, since an additional mask does not need to be used or a separate additional etching process is not required, processing costs may be maintained without change compared to a conventional semiconductor process.

(Step c)

Figure 5:
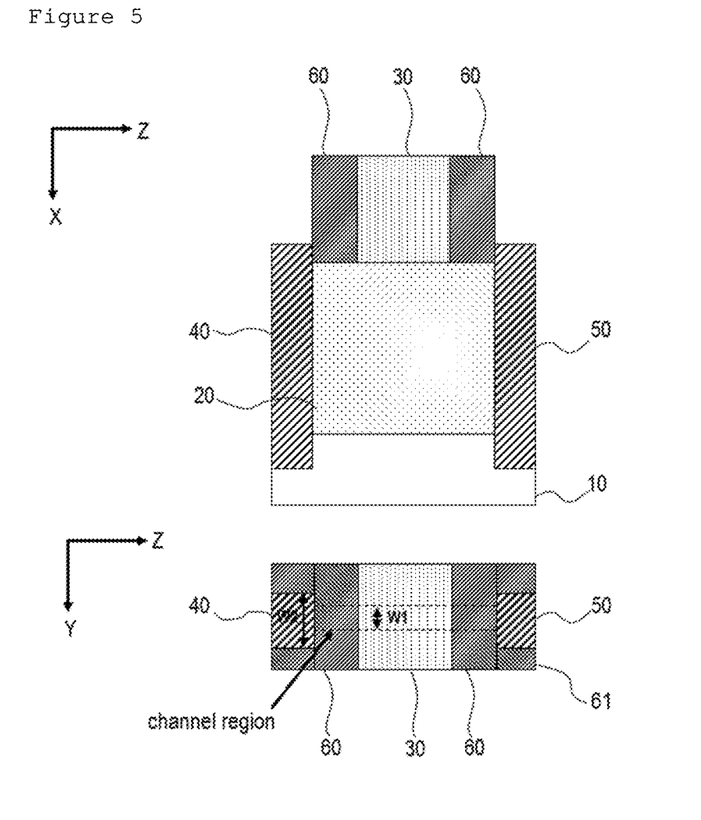

Next, the source/drain regions 40 and 50, in which growth in a width direction (Y-axis direction) is restricted, are formed in the exposed region of the substrate 10 and a region of the channel 20 using a selective epitaxial growth process (see FIG. 5).

In the case of the selective epitaxial growth process, one or more materials selected from among Si, SiGe, Ge, Sn (tin), and compounds of Group III to Group V may be applied, and, for example, solid-phase epitaxy (SPE), vapor-phase epitaxy (VPE), and liquid-phase epitaxy (LPE) methods may be used. According to an embodiment, the epitaxial layer may be formed due to epitaxial growth (e.g., hetero-epitaxy) using a chemical vapor deposition (CVD) method, a reduced-pressure chemical vapor deposition (RPCVD) method, an ultra-high-vacuum chemical vapor deposition (UHCVD) method, or a molecular beam epitaxy (MBE) method.

Due to the selective epitaxial growth process, the source/drain regions 40 and 50 may be restricted in the exposed region of the substrate 10, and may be grown vertically (a Z-axis direction) and laterally (a Y-axis direction) from the trench region so that the source/drain regions protrude from the upper surface of the channel 20 along the side surface of the channel 20 to thus come into contact with the insulating layer 60.

In the case of growth in the Y-axis direction, perpendicular to the X-axis direction, the lateral growth of the epitaxial structure in the Y-axis direction is restricted along the sidewall of the channel 20 by the patterned insulating layer 61 formed on the substrate 10.

Through the selective epitaxial growth process, n-type or p-type impurities are implanted into the source/drain regions 40 and 50 without a separate ion implantation process.

The type of impurity may depend on the type of the device (NMOS, PMOS), and may be an n-type for the NMOS and a p-type for the PMOS. For example, doping may be performed with one or more n-type impurities selected from among P, As, and Sb, or one or more p-type impurities selected from among B, $BF_2$, Al, and Ga.

If necessary, Si, SiGe, Ge, Sn (tin), and compounds of Group III to Group V may be mixed for use in increasing the stress effect of the channel 20, in addition to the above impurities. The compounds of Group III to Group V may be, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

After this process, the formed source/drain regions 40 and 50 may be effectively reduced in size compared to a conventional process. Specifically, the lateral growth of the epitaxial structure in the Y-axis direction may be restricted, thus reducing the sizes of the source/drain regions 40 and 50 in the field-effect-transistor structure that is ultimately manufactured. As a result, the grown epitaxial structure does not have a diamond shape at the top thereof, unlike the case of the conventional technology, and is provided such that the width ratio of the base and top of the epitaxial structure is about 1:1.

In particular, when the patterned insulating layer 61 is formed, the distance W2' (FIG. 4) between the patterns may be adjusted to thus adjust the width W2 (FIG. 5) of the source/drain regions 40 and 50, and the width of the source/drain regions 40 and 50 may be reduced so that the maximum width ratio (W1/W2) of the width W2 of each of the source/drain regions 40 and 50 to the width W1 of the channel 20 is 1, that is, the width of the source/drain regions may be reduced by the width of the channel 20.

The width of the source/drain regions 40 and 50 may be considered to be obtainable using an additional etching process, but this inevitably requires the addition of a new process using a mask, which leads to problems such as increased manufacturing costs and time and complexity of processing. However, the present invention secures the advantage of fundamentally overcoming the above problem merely by restricting the lateral growth of the epitaxial structure in the Y-axis direction without the addition of a mask.

(Additional Step)

Next, a known process of manufacturing a fin field-effect transistor is performed.

Specifically, after a replacement metal gate for replacing the region of the gate 30 is formed, a step of removing the patterned insulating layer 61, forming a metal silicide layer 70 on the source/drain regions 40 and 50, and forming source/drain metal wires 80 and 90 (FIG. 1) may be performed.

The replacement metal gate removes the existing gate 30, and forms a gate oxide 32, a work function metal 34, and a gate metal wire 36.

Figure 6:
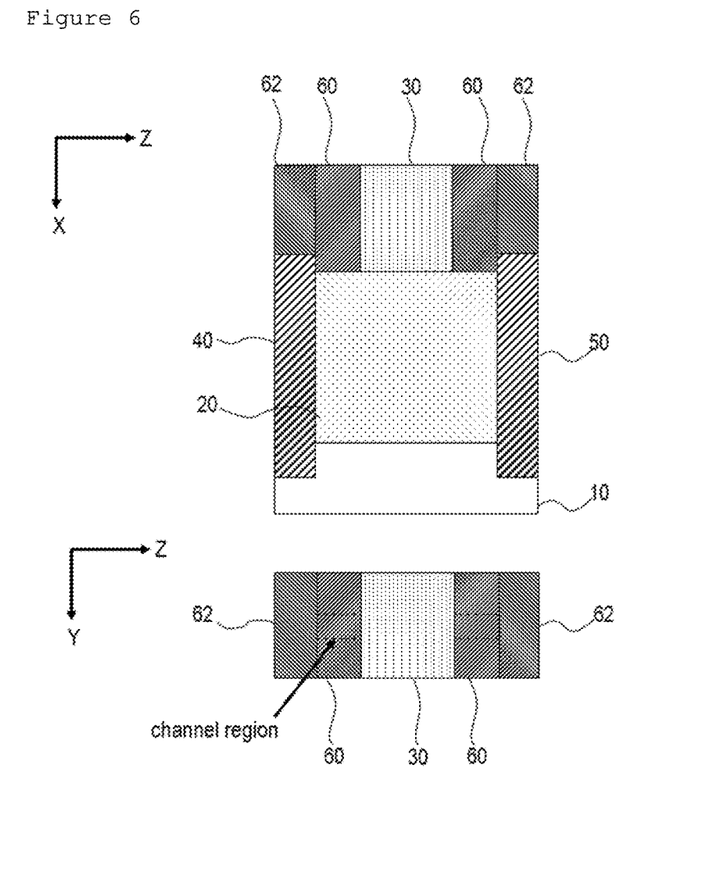

First, in order to remove the polysilicon used as the gate 30, an additional insulating layer 62 is deposited to block the source/drain regions 40 and 50 (see FIG. 6, a structure substantially wrapping the source/drain regions). The additional insulating layer 62 includes the same material as the insulating layer 60 (see FIG. 6).

Figure 7:
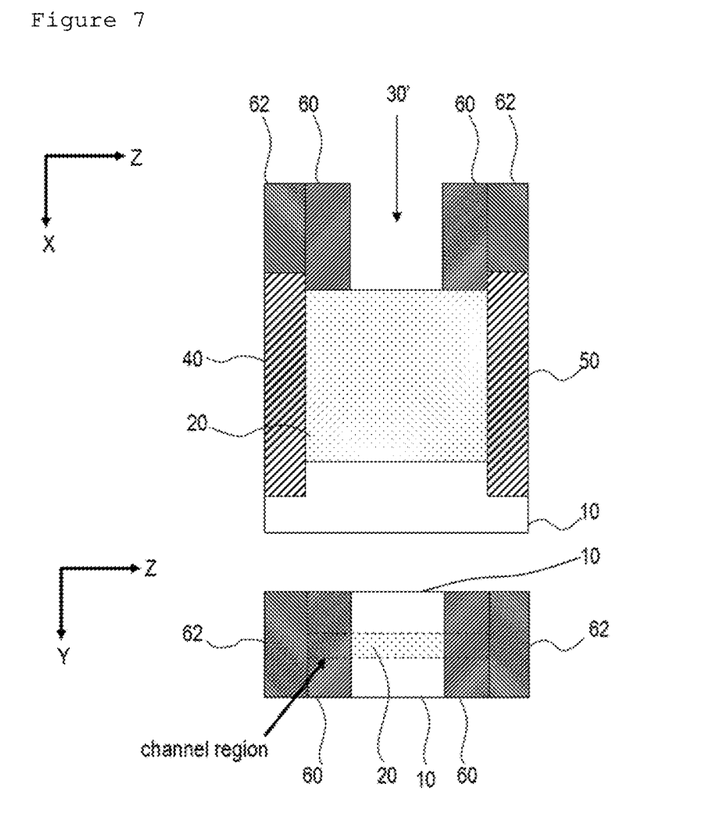

Next, the gate 30 is removed using the lithography process and the etching process to secure a gate formation region 30', and the channel 20 is exposed at the lower portion thereof (see FIG. 7).

Figure 8:
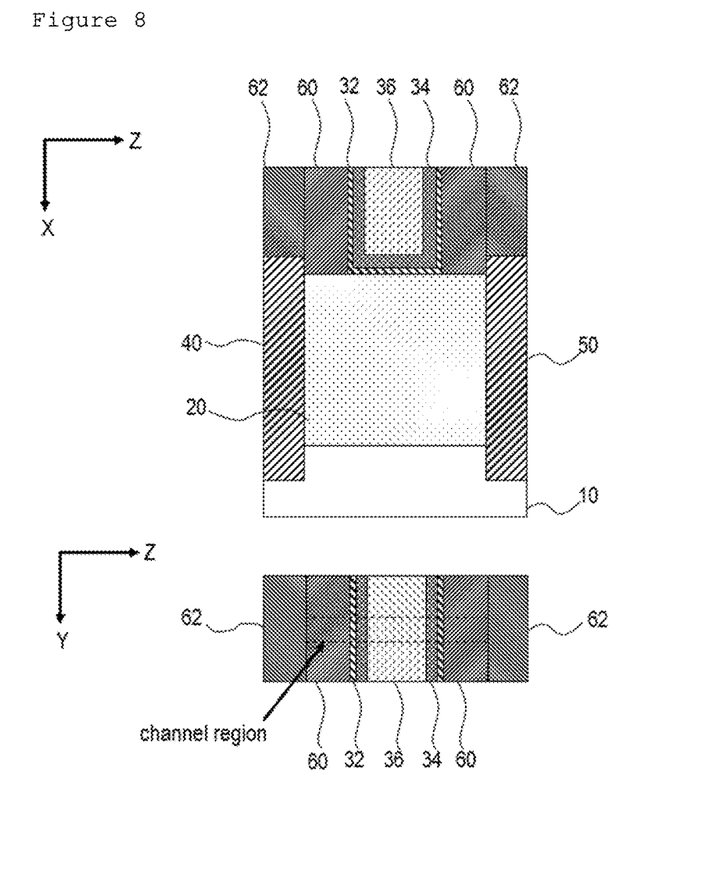

Next, the gate oxide 62, the work function metal 34, and the gate metal wire 36 are sequentially deposited in the gate formation region 30' using a deposition process, thus forming the replacement metal gate (see FIG. 8).

The gate oxide 32 may be $SiO_2$, $Al_2O_3$, $HfO_2$, $ZrO_2$, $Si_3N_4$, or perovskite oxide.

The work function metal 34 may be W, Al, Cr, or Ni, and may be deposited using a LPCVD (low-pressure chemical vapor deposition) method.

The gate metal wire 36 may include suitable conductive materials, for example, Al, W, or Cu, and may further include polysilicon, Ti, Ta, Hf, Zr, Ti, Ta, Ru, Pd, Pt, Co, Ni, or metal alloys thereof, other suitable materials, or combinations thereof.

In addition, the gate region 30' may include, in addition to the above layer structure, a number of other layers, for example, a capping layer, a boundary layer, a diffusion layer, a hard mask layer, or a combination thereof, and the examples are not particularly limited in the present invention.

Figure 9:
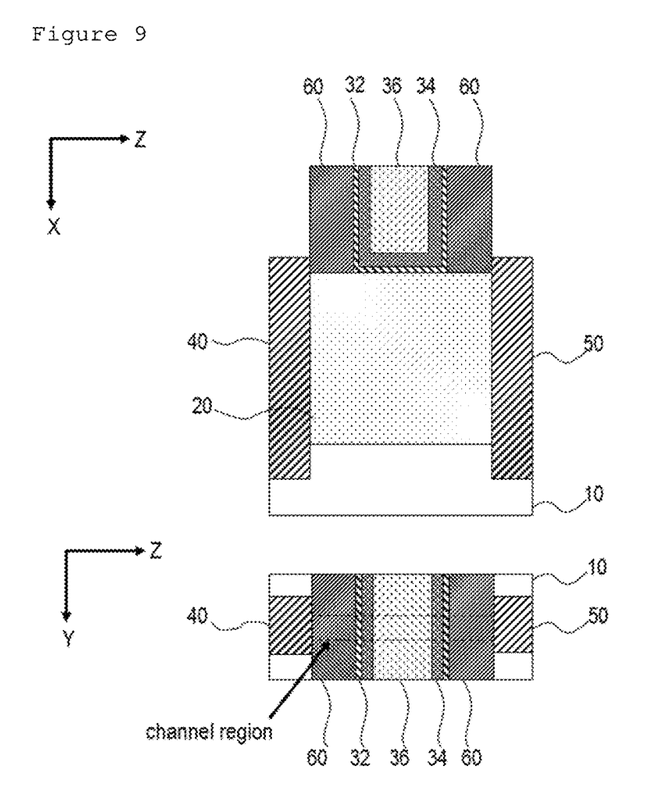

Next, the additional insulating layer 62, wrapping the upper portion of the source/drain regions 40 and 50, and the patterned insulating layer 61, wrapping the side surface thereof, are removed using the lithography process and the etching process, thus exposing predetermined regions of the source/drain regions 40 and 50 and the substrate 10 (see FIG. 9).

Figure 10:
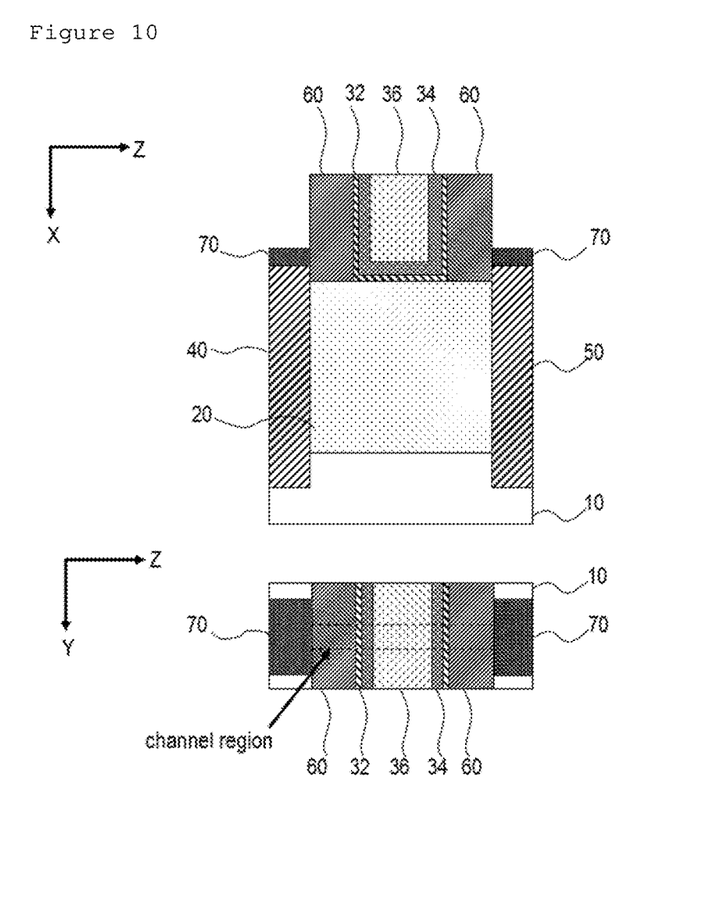

Next, a metal silicide layer 70 is formed, which wraps the exposed upper portion of the source/drain regions 40 and 50 and is electrically connected thereto (see FIG. 10).

As the material of the metal silicide layer 70, metals commonly used with semiconductors and Si may be used in bonding. For example, the material may be silicides containing Ni, Co, W, Ta, Ti, Pt, Er, Mo, Pd, or an alloy thereof. More specifically, examples of the metal silicide may include nickel silicide ($NiSi_2$), cobalt silicide ($CoSi_2$), tungsten silicide ($WSi_2$), tantalum silicide ($TaSi_2$), titanium silicide ($TiSi_2$), platinum silicide ($PtSi_2$), erbium silicide ($ErSi_2$), molybdenum silicide ($MoSi_2$), palladium silicide ($PdSi_2$), or a combination thereof, and are not particularly limited in the present invention. Further, the metal silicide layer 70 may be a single layer containing the above material or multiple layers including a double layer such as Ti/Cu.

Next, after the insulating layer is deposited so as to cover the source/drain region 40 and 50 and gate metal wire 36, source/drain metal wires 80 and 90 and gate metal wires (not shown in the drawings) are formed on the metal silicide layer 70 after the lithography process and the etching process.

As the material of the source/drain metal wires 80 and 90 and the gate metal wires 36, metals that are commonly used may be used, and examples thereof may include Cu, Mo, Al, Ag, Ti, Nb, W, Cr, Ta or an alloy thereof. The source/drain metal wires 80 and 90 may be a single layer containing the above material or multiple layers including a double layer such as Ti/Cu.

If necessary, in the fin field-effect transistor according to an embodiment of the present invention, in order to effectively prevent leakage current under the channel 20, impurities having a type opposite to that of the source/drain regions 40 and 50 are implanted at a high concentration into a predetermined region under the channel 20, thus forming a punch-through stopper (PTS) region.

It can be seen that the punch-through stopper 99 is positioned over the entire lower portion of the channel 20 and the entire lower portions of the source/drain regions 40 and 50 as shown in FIG. 1.

The punch-through stopper 99 may be applied before and after any one process among the above processes. However, since the formation of the punch-through stopper requires processes of impurity implanting and heat treatment to be performed, the source/drain regions 40 and 50 are applied on the substrate 10 before a selective epitaxial growth process and more preferably immediately before a process of forming a shallow trench isolation (STI) region so that the device is not damaged or otherwise deteriorated due to the above processes.

In the fin field-effect transistor according to an embodiment of the present invention as described above, lateral growth in a Y-axis direction is restricted using a patterned insulating layer so that source/drain regions are reduced in size, thus reducing the active area of a device and parasitic capacitance therein. Thereby, it is possible to improve the performance of the device. Further, a separate mask process is not performed, in contrast with a conventional semiconductor process, thus preventing additional processing cost.

Although embodiments of the present invention have been described above with reference to the accompanying drawings, the present invention may be implemented in other specific forms without changing the technical spirit or essential features thereof. Therefore, it should be understood that the embodiments described above are illustrative in all respects and not restrictive.

REFERENCE SIGNS LIST

10: substrate
20: channel
30: gate
32: gate oxide
34: work function metal
36: gate metal wire
40: source regions
50: drain regions
60: insulating layer
61: patterned insulating layer
62: additional insulating layer
70: metal silicide layer
80: source metal wires
90: drain metal wires
99: punch-through stopper

What is claimed is:

1. Method for manufacturing a fin field-effect transistor comprising:
   (a) forming a channel, a gate, and an insulating layer in a predetermined region of a substrate so that the insulating layer is formed from both sides of the gate on an upper portion of the substrate,
   (b) performing etching along side surfaces of the channel and the insulating layer so as to etch even an upper portion of one side of the substrate for forming source/drain regions, so that a designated region of the substrate is exposed and so that the insulating layer, patterned so as to wrap the exposed region of the substrate, is formed on the substrate, and
   (c) forming the source/drain regions, in which growth in a width direction (Y-axis direction) is restricted through a selective epitaxial growth process, in the exposed region of the substrate.

2. The method of claim 1, wherein the fin field-effect transistor is manufactured so that a maximum width ratio (W1/W2) of a width W2 of each of the source/drain regions to a width W1 of the channel is 1 based on a width direction (Y-axis direction, width) of the channel.

3. The method of claim 1, wherein the etching process of step (b) includes simultaneously forming the insulating layer, which is in contact with a side surface of the gate, and the patterned insulating layer, which is positioned on the substrate, using one mask.

4. The method of claim 1, wherein the etching process of step (b) is performed as an anisotropic etching process.

5. The method of claim 1, further comprising:
   after the forming the source/drain regions in step (c),
   forming a replacement metal gate and then removing the patterned insulating layer on the substrate; and
   forming a metal silicide layer.

6. The method of claim 1, wherein a punch-through stopper process is further performed prior to the selective epitaxial growth process in step (c).

7. The method of claim 1, wherein each of the source/drain regions is formed in a rectangular shape in XY-axis direction.

8. The method of claim 1, wherein the insulating layer includes one or more insulating materials selected from the group consisting of $SiO_2$, $Al_2O_3$, $HfO_2$, $ZrO_2$, $Si_3N_4$, perovskite oxide, and a combination thereof.

9. The method of claim 1, wherein the substrate includes silicon, germanium, tin, compounds of Group III to Group V, and a hetero-combined material.

10. The method of claim 1, wherein the substrate is doped with one or more n-type doping materials selected from among P, As, and Sb or one or more p-type doping materials selected from among B, $BF_2$, Al, and Ga.

11. The method of claim 1, wherein the field-effect transistor has any one among a multi-gate structure including a double- or triple-gate FinFET, a GAA (gate-all-around) structure (nanowire, nanosheet), a lateral structure in which channels are arranged in a lateral direction, or a vertical structure in which the channels are arranged in a vertical direction.

* * * * *